(12) United States Patent
Traughber et al.

(10) Patent No.: US 9,536,303 B2
(45) Date of Patent: Jan. 3, 2017

(54) MRI METHOD FOR ASSIGNING INDIVIDUAL PIXELS OR VOXELS TISSUE-SPECIFIC PET ATTENUATION VALUES

(71) Applicant: KONINKLIJKE PHILIPS N.V., Eindhoven (NL)

(72) Inventors: Bryan James Traughber, Shaker Heights, OH (US); Melanie Suzanne Kotys, Shaker Heights, OH (US); Raymond Frank Muzic, Jr., Mentor, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/383,580

(22) PCT Filed: Mar. 22, 2013

(86) PCT No.: PCT/IB2013/052288
§ 371 (c)(1),
(2) Date: Sep. 8, 2014

(87) PCT Pub. No.: WO2013/144799
PCT Pub. Date: Oct. 3, 2013

(65) Prior Publication Data
US 2015/0110374 A1    Apr. 23, 2015

Related U.S. Application Data

(60) Provisional application No. 61/617,095, filed on Mar. 29, 2012.

(51) Int. Cl.
*G06T 7/00* (2006.01)
*G01R 33/48* (2006.01)
*G01R 33/54* (2006.01)

(52) U.S. Cl.
CPC ........... *G06T 7/0012* (2013.01); *G01R 33/481* (2013.01); *G01R 33/543* (2013.01)

(58) Field of Classification Search
CPC ............ G06T 2207/10088; G06T 2207/10104; G06T 2207/10108; G06T 7/0012; A61B 5/00; A61B 5/0033; A61B 5/055; A61B 8/14; A61B 6/03; A61B 6/037; A61B 6/5205; A61B 6/5211; G06F 19/30; G06F 19/34; G01T 1/2985; G01T 1/1644
(Continued)

(56) References Cited

U.S. PATENT DOCUMENTS 6,486,669 B1    11/2002  Sinkus
2005/0113667 A1    5/2005  Schlyer
(Continued)

FOREIGN PATENT DOCUMENTS

BE    EP 2221627 A1 *  8/2010  ......... G01R 33/4808
WO    2005/019862    3/2005
WO    2008/127369    10/2008

OTHER PUBLICATIONS

Catana, C., et al.; Toward Implementing an MRI-Based PET Attenuation-Correction Method for Neurologic Studies on the MR-PET Brain Prototype; 2010; J. Nucl. Med.; 51(9)1431-1438.
(Continued)

*Primary Examiner* — Siamak Harandi
*Assistant Examiner* — Narek Zohrabyan

(57)    ABSTRACT

A magnetic resonance (MR) system (10) generates an attenuation or density map. The system (10) includes a MR scanner (48) defining an examination volume (16) and at least one processor (54). The at least one processor (54) is programmed to control the MR scanner (48) to apply imaging sequences to the examination volume (16). In response to the imaging sequences, MR data sets of the
(Continued)

examination volume (16) are received and analyzed to identify different tissue and/or material types found in pixels or voxels of the attenuation or density map. One or more tissue-specific and/or material-specific attenuation or density values are assigned to each pixel or voxel of the attenuation or density map based on the tissue and/or material type(s) identified as being in each pixel or voxel during the analysis of the MR data sets. In one embodiment, the tissue and/or material types are identified on the basis of a time series of MR phase images.

18 Claims, 3 Drawing Sheets

(58) Field of Classification Search
USPC .......................................................... 382/131
See application file for complete search history.

(56) References Cited

U.S. PATENT DOCUMENTS

| 2009/0234237 | A1* | 9/2009 | Ross ...................... A61B 5/026 600/504 |
| 2010/0052674 | A1 | 3/2010 | Jellus et al. |
| 2010/0204563 | A1 | 8/2010 | Stodilka et al. |
| 2010/0290683 | A1 | 11/2010 | Demeester |
| 2011/0123083 | A1* | 5/2011 | Ojha ...................... G01N 24/08 382/131 |
| 2011/0158497 | A1 | 6/2011 | Schweizer et al. |
| 2011/0257509 | A1 | 10/2011 | Olsen |
| 2013/0336564 | A1* | 12/2013 | Hu ....................... G01R 33/481 382/131 |
| 2014/0296696 | A1* | 10/2014 | Remmele ........... G01R 33/4816 600/410 |

OTHER PUBLICATIONS

Franke, J., et al.; UTILE—A fast combined UTE-DIXON four class attenuation correction technique for PET/MR; 2011; Proc. Intl. Soc. Reson. Med.; 19:4581.

Hofman, M., et al.; MRI-based Attenuation Correction for Whole-Body PET/MRI: Quantitative Evaluation of Segmentation-and-Atlas-Based Methods; 2011; The Journal of Nuclear Medicine; 52(9)1392-1399.

Hofman, M., et al.; Towards quantitative PET/MRI: a review of MR-based attenuation correction techniques; 2009; Eur. J. Nucl. Med.; 36 (Suppl):S93-S104.

* cited by examiner

MRI METHOD FOR ASSIGNING INDIVIDUAL PIXELS OR VOXELS TISSUE-SPECIFIC PET ATTENUATION VALUES

CROSS REFERENCE TO RELATED APPLICATIONS

This application is a national filing of PCT application Serial No. PCT/IB2013/052288, filed Mar. 22, 2013, published as WO 2013/144799 A1 on Oct. 3, 2013, which claims the benefit of U.S. provisional application Ser. No. 61/617,095 filed Mar. 29, 2012, which is incorporated herein by reference.

The present application relates generally to medical imaging. It finds particular application in conjunction with magnetic resonance (MR) systems, and will be described with particular reference thereto. However, it is to be understood that it also finds application in other usage scenarios and is not necessarily limited to the aforementioned application.

In the past, computed tomography (CT) has been utilized for attenuation correction (AC) in diagnostic positron emission tomography (PET) and tissue density in simulation sessions for radiation therapy (RT) planning Namely, CT typically measures radiodensity of tissue in Hounsfield units, which correlate with radiation attenuation and tissue density. Advances in medical imaging have led to the development of hybrid PET/MR and MR/RT systems, as well as MR-based simulation. However, unlike CT, MR signal intensity does not correlate directly with radiation attenuation (e.g., mu-values) or tissue densities and presents a technical challenge for the generation of attenuation or density maps.

To date, most research has focused on methods to differentiate or "segment" tissues from MR images into different classes, such as soft-tissue, bone and air, using "normal" anatomy or atlases or model-based approaches (i.e., shape-finding). However, such methodologies perform poorly for patients with abnormal anatomy, which is more frequent in some patient populations due to inherent disease processes or medical intervention, such as surgery and irradiation. Further, such methodologies fail to address that multiple tissue types can be located within a single image pixel or voxel. These limitations potentially lead to clinically significant inaccuracies, especially in the context of RT planning where patient dosimetry is calculated quantitatively on a pixel-to-pixel basis. Moreover, segmentation techniques are also time intensive to perform, often incorporating manual review and adjustment steps, which reduce patient throughput.

The present application provides new and improved methods and systems which overcome the above-referenced challenges.

In accordance with one aspect, a magnetic resonance (MR) system generates a map. The system includes an MR scanner defining an examination volume and at least one processor. The processor(s) are programmed to control the MR scanner to apply imaging sequences to the examination volume. In response to the imaging sequences, MR data sets are received and analyzed to identify different tissue and/or material types found in pixels or voxels of the map. One or more tissue-specific and/or material-specific values are assigned to each pixel or voxel of the map based on the tissue and/or material type(s) identified as being in each pixel or voxel during the analysis of the MR data sets.

In accordance with another aspect, a method generates a map. The method includes controlling an MR scanner to apply imaging sequences to an examination volume defined by the MR scanner. In response to the imaging sequences, MR data sets are received and analyzed to identify different tissue and/or material types found in pixels or voxels of the map. One or more tissue-specific and/or material-specific values are assigned to each pixel or voxel of the map based on the tissue type(s) identified as being in each pixel or voxel during the analysis of the MR data sets.

In accordance with another aspect, a magnetic resonance (MR) system generates a map. The system includes a MR scanner defining an examination volume and at least one processor. The processor(s) are programmed to control the MR scanner to apply imaging sequences to the examination volume. In response to the imaging sequences, MR data sets are received and analyzed to identify different tissue and/or material types found in pixels or voxels of a map. One or more tissue-specific and/or material-specific attenuation or density values are assigned to each pixel or voxel of the map based on the tissue and/or material type(s) identified as being in each pixel or voxel during the analysis of the MR data sets. The system further includes at least one of: (1) a therapy system using the tissue-specific and/or material-specific values for therapy planning; and (2) a positron emission tomography (PET)/single photon emission computed tomography (SPECT) system using the tissue-specific and/or material-specific values for attenuation correction.

In accordance with another aspect, a system comprising a magnetic resonance (MR) scanner defining an examination volume and at least one processor is provided. The at least one processor is programmed to control the MR scanner to apply imaging sequences to the examination volume. Further, the at least one processor is programmed to, in response to the imaging sequences, receive MR phase data of a series of echo time (TE) acquisitions and identify change in phase over time of the MR phase data. Change in phase over time is identifyed to identify different tissue and/or material types found in the examination volume.

One advantage resides in generating tissue-specific and/or material-specific attenuation or density values for each pixel or voxel of a target image.

Another advantage resides in a plurality of tissue-specific and/or material-specific attenuation or density values for each pixel or voxel of a target image, the plurality of values weighted according to their contribution to overall signal intensity.

Another advantage resides in improved patient throughput.

Another advantage resides in greater accuracy.

Another advantage resides in classifying tissue types utilizing magnetic resonance (MR) signal phase and/or magnitude, or the real and/or imaginary MR signal parts.

Still further advantages of the present invention will be appreciated by those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
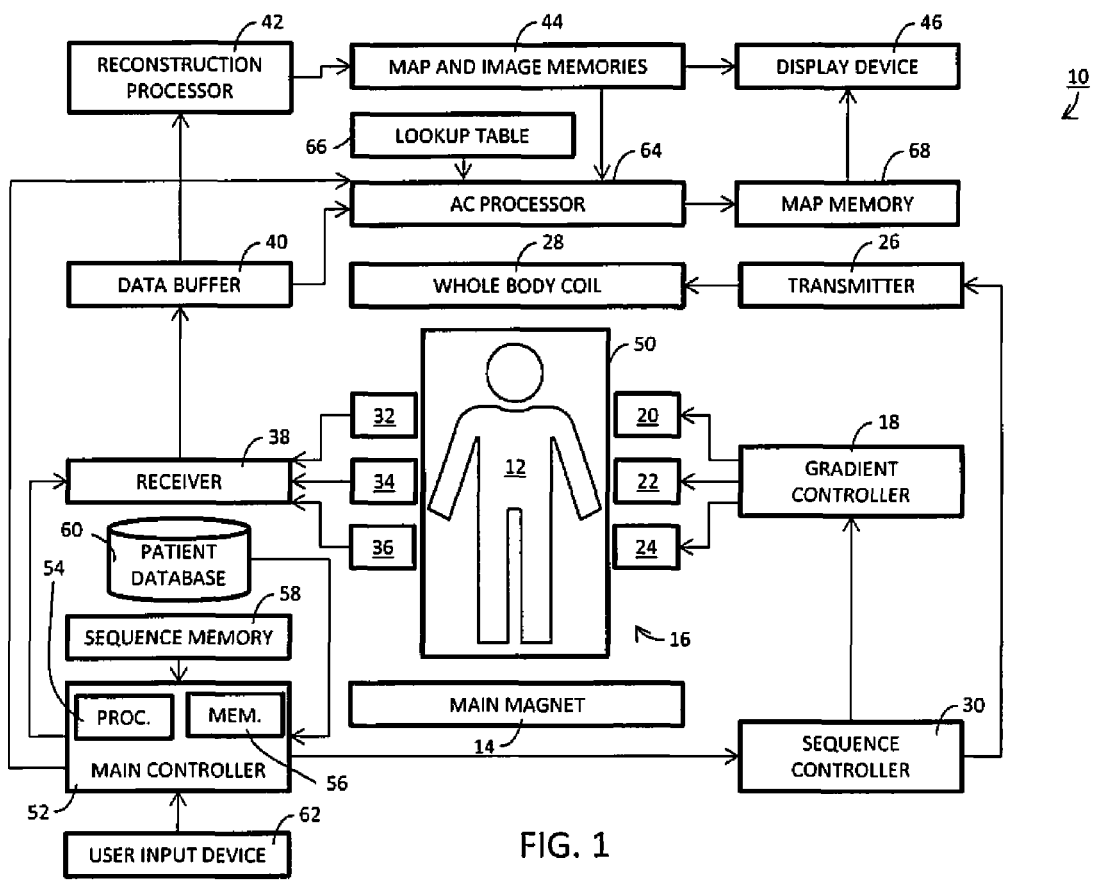
FIG. 1 illustrates a magnetic resonance (MR) system for determining tissue-specific and/or material-specific attenuation or density values for each pixel or voxel of an MR image.

With reference to FIG. 1, a magnetic resonance (MR) system 10 utilizes magnetic resonance to form two- or three-dimensional images of a subject 12. The system 10 includes a main magnet 14 that creates a strong, static $B_0$ magnetic field extending through an examination volume 16. The examination volume 16 is sized to accommodate the subject 12. The strength of the static $B_0$ magnetic field is commonly one of 0.23 Tesla, 0.5 Tesla, 1.5 Tesla, 3 Tesla, 7 Tesla, and so on in the examination region 16, but other strengths are contemplated.

A gradient controller 18 controls a plurality of magnetic field gradient coils 20, 22, 24 to selectively superimpose magnetic field gradients, such as x, y and z gradients, on the static $B_0$ magnetic field in the examination volume 16. Further, a transmitter 26 transmits $B_1$ resonance excitation and manipulation radio frequency (RF) pulses into the examination volume 16 with one or more transmit coils 28, such as a whole body coil. The $B_1$ pulses are typically of short duration and, when taken together with the magnetic field gradients, achieve a selected manipulation of magnetic resonance. For example, the $B_1$ pulses excite the hydrogen dipoles to resonance and the magnetic field gradients encode spatial information in the frequency and phase of the resonance signal. By adjusting the RF frequencies, resonance can be excited in other dipoles, such as phosphorous, which tend to concentrate in known tissues, such as bones. A sequence controller 30 controls the transmitter 26 and/or the gradient controller 18 to implement a selected imaging sequence within the examination volume 16, the imaging sequence defining a sequence of $B_1$ pulses and/or magnetic field gradients.

In response to an imaging sequence, spatially encoded magnetic resonance signals corresponding to a map or image of the subject 12 are produced from the examination volume 16. These spatially encoded magnetic resonance signals are received by a plurality of receive coils 32, 34, 36, such as a whole body receive coil or local receive-only coils. A receiver 38 demodulates the received signals to an MR data set corresponding to, for example, k-space data trajectories and stores the MR data set in a data buffer (e.g., a memory) 40. The MR data set can be employed for reconstruction of a map or image by a reconstruction processor 42. The reconstruction processor 42 spatially decodes the spatial encoding by the magnetic field gradients to ascertain a property of the resonance signal from each spatial region, such as a pixel or voxel. The intensity or magnitude of the signal is commonly ascertained, but other properties related to phase, relaxation time, magnetization transfer, and the like can also be ascertained. Further, the real and the imaginary parts of the signal can be used determine phase and/or magnitude. The converse also holds. Reconstructed maps or images of various properties are then stored in map and image memories 44 and, optionally, displayed on a display device 46.

Figure 2:
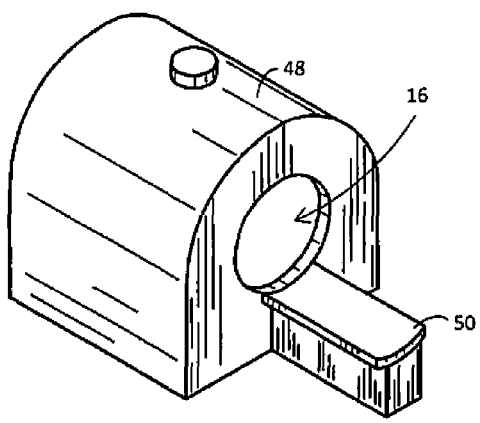
FIG. 2 illustrates a schematic diagram of a bore-type MR scanner.

With reference to FIG. 2, the MR system 10 includes a scanner 48 and, optionally, a support 50. The scanner 48 defines the examination volume 16 and includes the main magnet 14, the receive coils 32, 34, 36, the gradient coils 20, 22, 24, and the transmit coils 28 positioned around the examination volume 16. The scanner 48 can also, but need not, include one or more of the transmitter 26, the receiver 38, the gradient controller 18, and the sequence controller 30. The support 50 supports the subject 12 and facilitates positioning the subject 12 in the examination volume 16 during imaging. As illustrated, the scanner 48 is bore-type, but C-type, open-type, or the like are contemplated.

Referring back to FIG. 1, during imaging, the subject 12 is arranged in the examination volume 16. The main magnet 14 generates the static $B_0$ magnetic field with which hydrogen or other nuclear dipoles in the subject 12 preferentially align. Further, a main controller 52 controls the sequence controller 30 and the receiver 38 to generate a plurality of MR data sets of the subject 12. The main controller 52 does so by way of a processor 54 executing computer executable instructions on a memory 56.

A sequence memory 58 stores a plurality of magnetic resonance sequences that are known in the art. The various sequences have been developed to optimize various functional, physiological and anatomical examinations. Sequences have been developed for differentiating lipids and soft tissue, for differentiating between soft tissue and scar tissue, for differentiating between cancerous and non-cancerous tissue, for differentiating various organ or tissue types, for measuring perfusion, for imaging or identifying bone, for imaging or locating metal, and many more. The main controller 52 can access a patient records database 60 to retrieve information about one or more of the patient to be examined, the nature of the examination(s) to be conducted, and the like. This patient information can be used to help select among the sequences stored in the sequence memory 58. For example, if the patient has had surgery in which metal clips, screws, stents or the like have been implanted, the sequence for identify metal is selected. A sequence for identifying scar tissues is also retrieved if the nature of the patient treatment calls for differentiating between the radiation attenuation of soft tissue and scar tissue. The sequence controller 30 is controlled according to the selected imaging sequences, and the receiver 38 is controlled to generate an MR data set corresponding to each of the imaging sequences. When the imaging sequences include a plurality of imaging sequences, the main controller 52 iterates through the imaging sequences to control the sequence controller 30 and the receiver 38.

The imaging sequences selected include, for example, one or more of multi-echo sequences with ultra-short echo times (TEs), slice encoding for metal artifact correction (SEMAC) sequences, and DIXON sequences. Typically, the TE values of the echos of the multi-echo UTE sequences vary. Each of the imaging sequences leads to the generation of one of the MR data sets, which can be reconstructed into a map or image and allow identification of at least one tissue and/or material type within a volume of the subject 12. Hence, each of the imaging sequences yields MR data which differentiates between two or more tissue and/or material types, or identifies a tissue and/or material type in each pixel or voxel volume of the subject 12. Tissue and/or material types include one or more of air, bone, lung, metal, fat, water, plastic and the like. The imaging sequences are selected, typically by the main controller 52, based on one or a combination of selections schemes, such as the selection schemes discussed hereafter.

According to one selection scheme, a user of the MR system 10 manually selects the imaging sequences, or tissue and/or material types, within the examination volume 16 using a user input device 62 of the MR system 10. As to the latter, the imaging sequences are then automatically selected based on the selected tissue and/or material types. Optionally, a display device, such as the display device 46, can present the user with a listing of available sequences and information about the use of each sequence to allow the user to select the imaging sequences, or the tissue and/or material types, using the user input device 62. For example, the user can manually select the imaging sequences to acquire MR data sets allowing identification of tissues and/or materials of interest.

According to another selection scheme, the imaging sequences are selected based on the expected tissue and/or material types. Expected tissue and/or material types can be determined automatically from the patient records database 60. For example, if a patient medical record indicates a patient includes metal screws from a past surgery within the volume, an imaging sequence for acquiring an MR data set allowing identification of metal is selected.

According to another selection scheme, the imaging sequences are selected on an as-needed basis. That is to say, an imaging sequence is selected and an MR data set generated in response to the selected imaging sequence is analyzed. If there are unidentified tissue and/or material types within the examination volume 16, another imaging sequence is selected and analyzed. This repeats until the tissue and/or material types in all of the voxels within the examination volume 16 are identified. An AC processor 64 suitably performs analysis of each voxel of the various maps and images or other information from the MR data set to determine whether additional MR data sets are needed. In which case, the main controller 52 coordinates with the AC processor 64 when employing this selection scheme.

During imaging and/or after imaging, the AC processor 64 analyzes the MR data sets and the maps and images to quantitatively assess the tissue and/or material types(s) contained within each voxel, the tissue and/or material types(s) each having known radiation attenuation and/or density values. The value of each pixel or voxel is analyzed to determine one or more tissue and/or material types each pixel or voxel can and cannot be or a probability that each voxel contains each of two or more tissue and/or material types. As to the latter, some of the pixels or voxels can overlay an interface between two or more tissue and/or material types, whereby pixels or voxels can represent two or more tissue and/or material types. The possible, probable, improbable, eliminated tissue and/or material types in the corresponding pixel or voxel of all the images or maps are used to determine which tissue and/or material type(s) are in the examination volume 16 within a preselected certainty. Optionally, the display device 46 can present the user with an image depicting the tissue and/or material type in each voxel or pixel.

The value of each pixel or voxel is typically the relative MR signal intensity of the pixel or voxel relative to other pixels or voxels of the map or image generated by the same sequence. The relative signal strengths can be used to estimate a relative proportion or probability of each tissue and/or material type. The value of each pixel or voxel can alternatively correspond to phase or other magnetic resonance properties. Typically, the value of each pixel or voxel is dependent upon the nature of the sequence used to generate the image or map.

The specific approach to quantification depends upon the imaging sequence employed for generation of the MR data set. For example, where an MR data set is generated using a multi-echo UTE sequence, such as a UTE mDIXON sequence, signal intensities of a plurality of echo times can be used to identify T2* decay properties of the tissue and/or material corresponding to the pixel or voxel. The specific decay of each pixel or voxel can be used to address a lookup table 66 which maps the decay time to one or more tissue-specific and/or material-specific attenuation or density values. Alternatively, the decay can be mapped to a tissue and/or material type, which has a known attenuation or density value. More generally, additional tissue and/or material properties may be defined and the properties used to determine the tissue and/or material type.

Figure 3A:
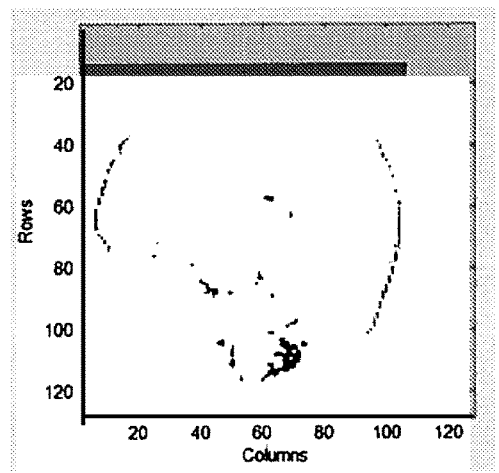
FIG. 3A illustrates a sagittal plane of an MR phase image.
Figure 3B:
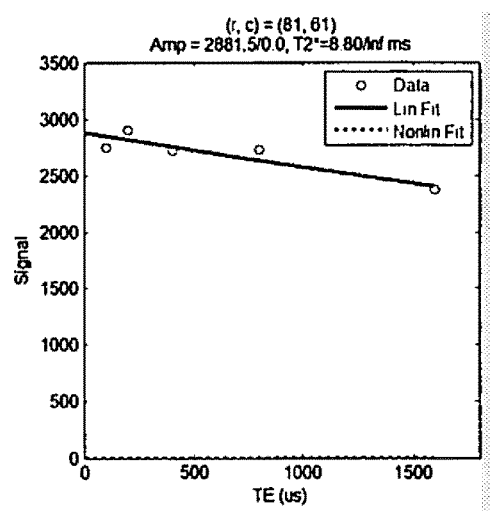
FIG. 3B illustrates data points captured during generation of the MR phase image of FIG. 3A.

While the foregoing focused on MR signal intensity imaging, MR phase imaging can also be used to generate identifying information about the tissue and/or material corresponding to each pixel or voxel. MR signal intensity imaging can be suboptimal due to the lack of quantification, the non-linear fit of signal contrast over time, and low signal to noise ratio (SNR). These limitations deter quantitative measurement of tissue properties over the time course of patient-care leading to inaccuracies in standardized uptake values (SUV) in positron emission tomography (PET) and present a barrier to the development of adaptive patient-specific dosimetry and treatment plans in radition therapy (RT) planning In contrast to MR signal intensity imaging, MR phase imaging has superior SNR, leading to improved image contrast in low signal tissues, such as cortical bone. In addition, MR phase imaging has a linear fit of tissue-dependent phase accumulation over time, making quantification practical and technically feasible. Such an approach provides a reliable means to monitor the same patient over time allowing assessment of tumor response to treatment with SUVs in PET and MR-based RT planning With reference to FIGS. 3A and 3B, the linearity of MR phase is illustrated. FIG. 3A illustrates a sagittal plane of an MR phase image. The vertical axis corresponds to rows, and the horizontal axis corresponds to columns, in the MR phase image. FIG. 3B illustrates data points captured during generation of the MR phase image for row 81, column 61 of the MR phase image. The vertical axis corresponds to signal intensity, and the horizontal axis corresponds to echo times in microseconds. A first line is fit to the data points to show the linearity. A second line is fit to data points (not visible) for signal intensity to shown the nonlinearity of signal intensity.

While MR phase imaging has certain advantages over MR signal intensity imaging, MR phase imaging is primarily used for quantification (e.g., T1, T2, T2* and diffusion mapping) despite MR phase imaging being capable of quantification. MR phase imaging is more difficult to use because of phase wrap and less direct anatomical information. Accordingly, MR phase imaging is generally limited to: (1) "susceptibility weighted imaging," and is typically only semi-quantitative and depends on information from the MR magnitude signal; and (2) quantification of certain contrast agents for certain geometries.

To overcome the foregoing challenges, a series of ultra-short TE acquisition sequences of MR phase data are used. Suitably, inphase TEs are chosen. Ultra short TEs (e.g., 0 to 1500 microseconds) are preferable to acquire signal from very short T2* species, such as cortical bone. For post-processing, the reconstruction processor 42 analyzes the MR phase data to: (1) unwrap the phase; and (2) then map the intensity of the series of images as a function of time, thus producing a series of phase accumulation maps. Phase unwrapping can, for example, be performed in accordance with the algorithm disclosed in Jenkinson M. Fast, Automated, N-dimensional Phase-Unwrapping Algorithm. Magn Reson Med 2003; 49:193-197. Each phase accumulation map corresponds to a different TE and is generated by accumulating the different intensities measured during the corresponding acquisition sequence for each pixel.

The change in phase over time (i.e., over the different TEs) is known to be linearly correlated to tissue type. Unlike known uses of MR phase, the MR phase is used by the AC processor 64 to allow generation of a quantitative map for all tissue types. The change in phase over time for each pixel or voxel is used to lookup the known tissue type for the change in phase over time. The quantitative map, in turn, can be used to generate AC maps (e.g., for PET-MR) and/or density maps (e.g., for MR RT planning and simulation) by mapping the different tissue types in the quantitative map to known AC values and/or density values of the tissue types in the quantitative map. The quantitative map can also be used to acquire sets of ultra-short TEs that can characterize additional tissues with very short $T2^*$.

In other embodiments of the analysis, the nature of each sequence which produces each map and the value of each voxel identifies magnetic resonance properties. The magnetic resonance properties of the corresponding pixels or voxels that correspond to the examination volume 16 of the subject 12 are analyzed to determine the tissue and/or material type(s) in each voxel. Various other analysis techniques are also contemplated.

Once the MR data sets are analyzed to identify tissue-specific and/or material-specific radiation attenuation or density values, the tissue-specific and/or material-specific attenuation or density values are normalized and combined to create a patient specific attenuation or density map. To determine radiation attenuation of radiation traversing a given beam or ray through the subject 12, a corresponding beam or trajactory is identified in the attenuation map. The attenuation values of the voxels falling in or partially in the beam or ray are summed by a percent contribution or inclusion within the beam or ray.

One challenge with combining the tissue-specific and/or material-specific attenuation or density values of the MR data sets in to the attenuation or density map is that the coordinate frames of the MR data sets and the target image may not align. Further, the spatial resolutions of the MR data sets and the target image may not be the same. Hence, the voxels or pixels of the MR data sets and the target image need to be correlated. Because the MR data sets and the target image overlap spatially, one approach is image registration. Using image registration, a registration map from a first image to a second image can be generated, which can be used to map a pixel or voxel in the first image to the corresponding pixel(s) or voxel in the second image.

Typically the resolutions of the images are the same, but the resolutions need not be the same. Where the resolutions of the first image and the second image differ, the pixels of the two images may not include a 1:1 correspondence. If the resolution of the second image is greater than the resolution of the first image, a pixel in the first image can map to a plurality of pixels in the second image. If the resolution of the second image is less than the resolution of the first image, a plurality of pixels in the first image can map to a single pixel in the second image. More generally, image-processing operations may be used to obtain images at the desired resolution. To combine the tissue-specific and/or material-specific attenuation or density values for a plurality of pixels in the first image, any approach can be employed. However, one approach is, for each tissue and/or material type, to average the attenuation or density values of the pixels.

Once the attenuation or density map is generated, it is stored in an attenuation or density memory 68. Further, it can be used for attenuation correction in PET/MR systems. Additionally, the attenuation or density map can be employed in hybrid MR/radiation therapy (RT) systems for treatment planning and monitoring. For example, the attenuation or density map can be employed for density correction in MR guided high intensity focused ultrasound (HIFU). As another example, the attenuation or density map can be employed for pixel- and/or voxel-based dosimetry in MR simulation. Additionally, the attenuation or density map can be employed for identifying iron in the liver or bone delineation for digitally reconstructed radiograph (DRR) generation.

Figure 4:
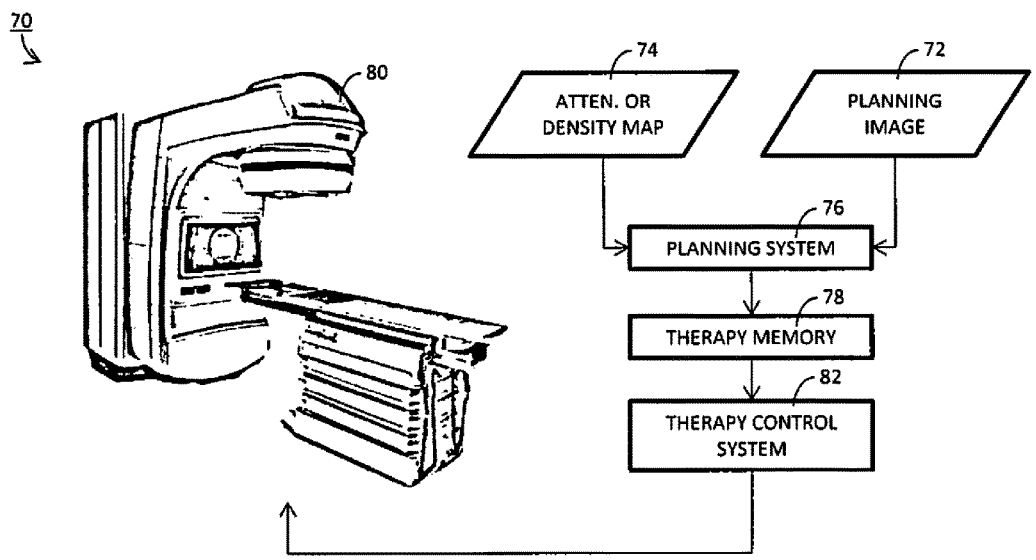
FIG. 4 illustrates a therapy system employing an attenuation or density map.

With reference to FIG. 4, a therapy system 70 (e.g., for MR RT planning and/or simulation) receives a planning image 72, such as three- or four-dimensional image, of the subject 12 from an imaging modality, such as the MR scanner 48. The image includes a target and, commonly, one or more organs at risk (OARs), the target being an organ or other tissue region which contains a lesion, such as a tumor, to be treated. Other imaging modalities from which the planning image 72 can be received include a computed tomography (CT) scanner, a positron emission tomography (PET) scanner, a single photon emission computed tomography (SPECT) scanner, a cone-beam computed tomography (CBCT) scanner, and the like. The therapy system 70 further receives an attenuation or density map 74 of tissue-specific and/or material-specific densities generated by the MR system 10. Suitably, the attenuation or density map 74 is registered to the planning image 72.

A therapy planning system 76 of the therapy system 70 receives delineates between tissue regions, such as the target and/or the organs at risk, in the planning image 72 typically using contours surrounding the regions. Further, using the attenuation or density map 74 and the contours of the target and/or the OARs, the therapy planning system 76 generates a treatment plan. The generated treatment plan takes in to account the tissue-specific and/or material-specific densities of the attenuation or density map 74 when generating the treatment plan, and suitably includes a plurality of fractions and a planned treatment volume (PTV) to be irradiated. The treatment plan is suitably stored in a therapy memory 78.

At a scheduled day and time for a therapy session of the subject 12, a therapy delivery apparatus 80 of the therapy system 70 delivers therapy to the subject 12. The therapy, such as ablation therapy and/or brachytherapy, can include radiation involving one or more of x-rays, gamma rays, protons, HIFU, focused ultrasound, and the like. Suitably, the therapy delivery apparatus 80 is controlled by a therapy control system 82 in accordance with the treatment plan.

Figure 5:
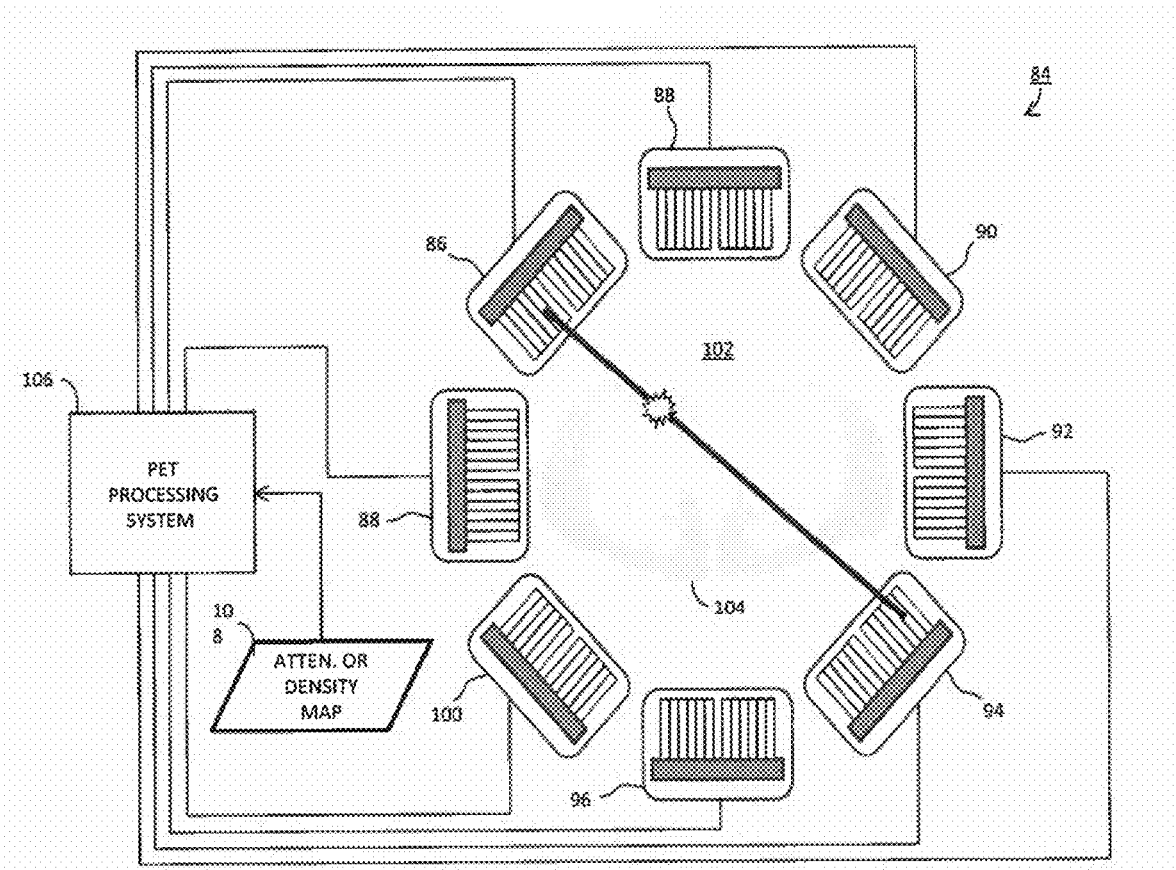
FIG. 5 illustrates a positron emission tomography (PET)/single-photon emission computed tomography (SPECT) system employing an attenuation or density map.

With reference to FIG. 5, a PET/SPECT system 84 includes a plurality of detector modules 86, 88, 90, 92, 94, 96, 98, 100 arranged, typically in a circle or a polygon approximating a circle, around an examination volume 102 into which a patient volume 104 is positioned. Further, the PET/SPECT system 84 can include a patient support (not shown), such as a patient bed, to support the patient and/or position the patient volume 104 in the examination volume 102. Examples of the imaged patient volume 104 include, but are not limited to, hearts, brains, thyroids, bones, joints, ligaments, tendons, muscles, nerves, kidneys, lungs, tumors, lesions, and so on.

Before imaging, the patient volume 104 is injected with one or more radioisotopes. Examples of such radioisotopes include, but are not limited to, F-18 C-11, Rb-82, N-13, O-15, Cu-64 for PET and Tc-99m, I-131, Ga-67, and In-111 for SPECT. The radioisotopes can be in the form of radioligands or material generally called a radiopharaceutical that binds to specific types of tissue and/or material, is preferentially absorbed by specific types of tissue and/or material, is normally excluded from certain spaces, or exhibits some other desired biodistribution. The patient volume 104 is then positioned in the examination volume 102. For example, the patient is positioned on the patient support and the patient support moves the patient volume 104 into the examination volume 102.

The detector modules 86, 88, 90, 92, 94, 96, 98, 100 receive gamma photons emitted by the radioisotopes injected into the patient volume 104 during imaging. The received gamma photons penetrate into, deposit energy within, and are detected by the detector modules 86, 88, 90, 92, 94, 96, 98, 100. For example, in PET and as illustrated, a pair of gamma photons are emitted from the patient volume 104 and strike a first detector module 86 and a second detector module 94 nearly simultaneously. The detector modules 86, 88, 90, 92, 94, 96, 98, 100 digitize detected events and send the digitized events with corresponding time stamps to a processing system 106 of the PET/SPECT system 84. The digitized events suitably identify the location of the corresponding gamma photon interaction in the detector, energy of the event and the time stamp.

During imaging, the processing system 106 acquires event data from the detector modules 86, 88, 90, 92, 94, 96, 98, 100 over a selected period of time, such as ten minutes. For each detection event, the detection event data typically includes a location of the detection event and information of the detector, energy of each event, and a time stamp. The event data is stored in a memory and reconstructed into a three-dimensional image representation. For PET, this includes filtering invalid events, pairing events based on the time stamps to define line of responses (LORs), and reconstructing the LORs into an image respresentation. For time of flight (TOF) PET, the time stamps associated with each LOR are used to localize the annihilation event which caused the gamma photon pair along the LOR. For SPECT, the reconstruction is similar except that the processing does not include pairing. Reconstruction is suitably performed using an attenuation or density map 108 generated by the MR system 10 for attenuation correction.

Figure 6:
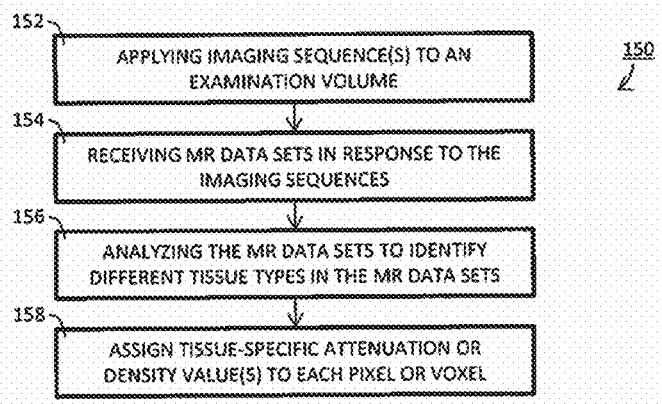
FIG. 6 illustrates a method for generating an attenuation or density map.

With reference to FIG. 6, a method 150 for generating an attenuation or density map is provided. The method 150 is performed by the MR system 10. The method 150 includes applying 152 a plurality of imaging sequences to the examination volume 16. Suitably, the imaging sequences include sequences which differentiate between different combinations of tissue and/or material types. In response to the imaging sequences, a plurality of MR data sets of a patient volume are received and registered 154. Each of the MR data sets is then analyzed 156 to identify different tissue and/or material types in the MR data set. For example, the data sets can be reconstructed into maps or images. The properties of the corresponding voxels in the maps or images can be employed to identify the tissue and/or material type(s) in the patient. Based on the tissue and/or material types, tissue-specific and/or material-specific attenuation or density values are assigned 158 to the corresponding pixels or voxels of the attenuation density image or map.

The method 150 can be further enhanced to iteratively acquire the MR data sets. Namely, the method 150 can include selecting one of the imaging sequences. For example, the initial selected imaging sequence can be a multi-echo UTE sequence with varying TEs. The selected imaging sequence is then applied to the examination volume 16 and, in response to the selected imaging sequence, at least one of the MR data sets are received. The first MR data set is then analyzed to determine the characteristics of tissue and/or material within of each pixel or voxel. In response to unidentified tissue and/or material, or artifacts, another one of the imaging sequences is selected and the foregoing steps are repeated. This process may be iterated with additional acquisitions and analyses. For example, metal cannot be identified with the multi-echo UTE sequence. Hence, if there are unidentified tissue and/or material types after the multi-echo UTE sequence, an imaging sequence for identifying metal, such as SEMAC can be selected.

It is to be appreciated that utilizing a pixel or voxel-based approach bypasses pitfalls associated with anatomy or atlas approaches to attenuation correction or density determination since it does not require normal anatomy or shape-finding. Further, by quantitatively assessing the resonance data corresponding to each voxel, more than one attenuation value for different tissue and/or material types can be assigned to each pixel or voxel and weighted according to their percent contribution to the overall signal intensity.

As used herein, a memory includes one or more of a non-transient computer readable medium; a magnetic disk or other magnetic storage medium; an optical disk or other optical storage medium; a random access memory (RAM), read-only memory (ROM), or other electronic memory device or chip or set of operatively interconnected chips; an Internet/Intranet server from which the stored instructions may be retrieved via the Internet/Intranet or a local area network; or so forth. Further, as used herein, a processor includes one or more of a microprocessor, a microcontroller, a graphic processing unit (GPU), an application-specific integrated circuit (ASIC), an FPGA, and the like; a controller includes: (1) a processor and a memory, the processor executing computer executable instructions on the memory embodying the functionality of the controller; or (2) analog and/or digital hardware; a user input device includes one or more of a mouse, a keyboard, a touch screen display, one or more buttons, one or more switches, one or more toggles, voice recognition engines, and the like; a database includes one or more memories; and a display device includes one or more of a LCD display, an LED display, a plasma display, a projection display, a touch screen display, and the like.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance (MR) system for generating a map, said system comprising:
   a MR scanner defining an examination volume; and,
   at least one processor programmed to:
      control the MR scanner to apply imaging sequences to the examination volume;
      in response to the imagine sequences, receive MR data sets of the examination volume wherein the MR data sets include MR phase data of a series of echo time (TE) acquisitions;
      identify change in phase over time of the MR phase data to identify different tissue and/or material types found in pixels car voxels of the map; and
      assign one or more tissue-specific and/or material-specific values to each pixel or voxel of the map based on the tissue and/or material type(s) identified as being in each pixel or voxel during the analysis of the MR data sets.

2. The MR system according to claim 1, wherein the map is an attenuation or density map.

3. The MR system according claim 1, wherein the tissue-specific and/or material-specific values corresponding to the found tissue and/or material types are weighted based on fractional or percent contribution.

4. The MR system according to claim 1, wherein the at least one processor further programmed to:
(a) select one of the imaging sequences;
(b) apply the selected imaging sequence to the examination volume;
(c) in response to the selected imaging sequence, receive at least one of the MR data sets;
(d) analyze the at least one MR data set to determine tissue and/or material types within the at least one MR data set; and,
(e) in response to unidentified tissue in the at least one MR data set, repeat (a)-(e) for another one of the imaging sequences.

5. The MR system according to claim 1, wherein the at least one processor is further programmed to:
access a patient database or other records to determine expected tissue and/or material types in the examination volume; and,
select the imaging sequences based on the expected tissue and/or material types within the examination volume.

6. The MR system according to claim 1, wherein the map is an attenuation map, wherein that at least one processor is further programmed to:
generate a positron emission tomography (PET) image using the map for attenuation correction.

7. The MR system according to claim 1, wherein the at least one processor is further programmed to:
unwrap phase of the MR phase data; and
generate a series of phase accumulation maps corresponding to the series of TE acquisitions from the unwrapped MR phase data, wherein change in phase is generated from the phase accumulation maps.

8. A method for generating a map, said method comprising:
controlling an MR scanner to apply imaging sequences to an examination volume defined by the MR scanner;
in response to the imaging sequences, receiving MR data sets of the examination volume, the MR data sets including MR phase data of a series of echo time (TE) acquisitions;
identifying change in phase over time of the MR phase data to identify different tissue and/or material types found in pixels or voxels of the map; and
assigning one or more tissue-specific and/or material-specific values to each pixel or voxel of the map based on the tissue and/or material type(s) identified as being in each pixel or voxel during the analysis of the MR data sets.

9. The method according to claim 8, wherein the map is an attenuation or density map.

10. The method according to claim 8, wherein the analyzing includes:
from the MR data sets determining magnetic resonance properties of the tissue and/or material in each pixel or voxel directly or with regard to interaction with contrast agents; and,
analyzing the magnetic resonance properties of the corresponding pixels or voxels to determine the tissue ant or material types.

11. The method according to claim 8, wherein the map is an attenuation map, said method further including:
generating a positron emission tomography (PET) image using the map for attenuation correction.

12. The method according to claim 8, further including:
unwrapping phase of the MR phase data; and
generating a series of phase accumulation maps corresponding to the series of TE acquisitions from the unwrapped MR phase data, wherein change in phase is generated from the phase accumulation maps.

13. At least one processor programmed to perform the method according to claim 8.

14. A non-transitory computer readable medium carrying software which controls one or more processors to perform the method according to claim 8.

15. A system comprising:
a magnetic resonance (MR) scanner defining an examination volume; and,
at least one processor programmed to:
control the MR scanner to apply imaging sequences to the examination volume;
in response to the imaging sequences, extract MR phase data from a series of echo time (TE) acquisitions; and
identify a change in phase over time of the MR phase data to identify different tissue and/or material types found in the examination volume.

16. The system according to claim 15, further including:
unwrapping phase of the MR phase data; and
generating a series of phase accumulation maps corresponding to the series of TE acquisitions from the unwrapped MR phase data, wherein change in phase is generated from the phase accumulation maps.

17. The system according to claim 16, wherein the TEs of the series of TE acquisitions are inphase and ultra-short.

18. The system according claim 15, wherein that at least one processor is further programmed to: generate a positron emission tomography (PET) image using known attenuation correction values associated with the different tissue and/or material types found in the examination volume.

* * * * *